(12) United States Patent
Clavelle et al.

(10) Patent No.: US 11,828,405 B2
(45) Date of Patent: *Nov. 28, 2023

(54) TRANSFER LINE EXCHANGER

(71) Applicant: NOVA Chemicals (International) S.A., Fribourg (CH)

(72) Inventors: Eric Clavelle, Calgary (CA); Edgar Yajure, Calgary (CA); Leslie Wilfred Benum, Red Deer (CA); Edward Christopher Foy, Calgary (CA); David Eisenhawer, Red Deer (CA)

(73) Assignee: NOVA Chemicals (International) S.A., Fribourg (CH)

( * ) Notice: Subject to any disclaimer, the term of this patent is extended or adjusted under 35 U.S.C. 154(b) by 613 days.

This patent is subject to a terminal disclaimer.

(21) Appl. No.: 17/030,432

(22) Filed: Sep. 24, 2020

(65) Prior Publication Data
US 2021/0010618 A1    Jan. 14, 2021

Related U.S. Application Data

(60) Continuation of application No. 15/001,881, filed on Jan. 20, 2016, now Pat. No. 10,816,111, which is a
(Continued)

(30) Foreign Application Priority Data

Dec. 20, 2012 (CA) ................................ CA 2799372

(51) Int. Cl.
*F16L 9/00* (2006.01)
*G06F 30/20* (2020.01)
(Continued)

(52) U.S. Cl.
CPC ............... *F16L 9/006* (2013.01); *C10G 9/00* (2013.01); *F16L 43/002* (2013.01); *G06F 30/20* (2020.01); *Y10T 428/13* (2015.01)

(58) Field of Classification Search
CPC ......... F16L 9/006; F16L 43/002; G06F 30/20; C10G 9/00; Y10T 428/13
See application file for complete search history.

(56) References Cited

U.S. PATENT DOCUMENTS 2,303,950 A   12/1942  Nordell
3,574,781 A    4/1971  Racine et al.
(Continued)

FOREIGN PATENT DOCUMENTS

WO    WO2011094169    8/2011

OTHER PUBLICATIONS

Helgason E, Krajnović S. Aerodynamic shape optimization of a pipe using the adjoint method. InASME International Mechanical Engineering Congress and Exposition Nov. 9, 2012 (vol. 45233, pp. 259-267). American Society of Mechanical Engineers. (Year: 2012).*
(Continued)

*Primary Examiner* — Chuen-Meei Gan
(74) *Attorney, Agent, or Firm* — Fish & Richardson P.C.

(57) ABSTRACT

The present invention provides a transfer line exchanger which is optimized for one or more objective functions of interest such as pressure drop, erosion rate, fouling, coke deposition and operating costs. The transfer line exchanger is designed by computer modeling a transfer line exchanger in which the cross section of flow path is substantially circular and modeling the operation of the transfer line under industrial conditions to validate the model design and its operation. Then iteratively the model design is deformed and the operation of the deformed part is modeled and compared to values obtained with other deformed models until the value of the objective function is optimized (e.g. at an extreme) or the change in the objective function is approaching zero.

12 Claims, 8 Drawing Sheets

Related U.S. Application Data division of application No. 14/082,522, filed on Nov. 18, 2013, now Pat. No. 9,273,805.

(51) Int. Cl.
  *C10G 9/00* (2006.01)
  *F16L 43/00* (2006.01)

(56) References Cited

U.S. PATENT DOCUMENTS

| | | | |
|---|---|---|---|
| 6,041,171 A | | 3/2000 | Blaisdell et al. |
| 6,778,871 B2 * | | 8/2004 | Holman ................ G06F 30/00 700/106 |
| 6,824,883 B1 | | 11/2004 | Benum et al. |
| 6,899,966 B2 | | 5/2005 | Benum et al. |
| 7,128,139 B2 | | 10/2006 | Oballa et al. |
| 7,278,828 B2 | | 10/2007 | Steplewski et al. |
| 7,398,193 B2 | | 7/2008 | Araki et al. |
| 7,488,392 B2 | | 2/2009 | Benum et al. |
| 9,273,805 B2 | | 3/2016 | Clavelle et al. |
| 10,816,111 B2 | | 10/2020 | Clavelle et al. |
| 2008/0302702 A1 | | 12/2008 | Devakottai et al. |
| 2013/0263436 A1 | | 10/2013 | Hirase et al. |

OTHER PUBLICATIONS

Oberkampf WL, Trucano TG. Verification and validation in computational fluid dynamics. Progress in aerospace sciences. Apr. 1, 2002;38(3):209-72. (Year: 2002).*

Gough WD. Automated Flow Path Design Optimization Using Mesh Morphing. Brigham Young University; 2011. (Year: 2011).*

Markus Stephan et al., "CFD topology optimization of automotive components," 2009, 4th European Automotive Simulation Conference, 12 pages.

Quamrul H. Mazumder, "CFD analysis of single and multiphase flow characteristics in elbow," online Apr. 2012, Engineering, 4(4):210-214.

Quamrul H. Mazumder, "CFD analysis of the effect of elbow radius on pressure drop in multiphase flow," Sep. 2012, Modelling and Simulation in Engineering, vol. 2012, 8 pages.

Peter Nortoft Nielsen, "Isogeometric analysis and shape optimization in fluid mechanics," Feb. 2012, Kgs. Lyngby: Technical University of Denmark, 158 pages.

PCT International Search Report and Written Opinion in International Appln. No. PCT/CA2013/000934, dated Feb. 27, 2014, 10 pages.

* cited by examiner

TRANSFER LINE EXCHANGER

REFERENCE TO RELATED APPLICATION

This application is a continuation of U.S. patent application Ser. No. 15/001,881, filed on Jan. 20, 2016, which is a divisional of U.S. patent application Ser. No. 14/082,522 filed on Nov. 18, 2013, which granted as U.S. Pat. No. 9,273,805 on Mar. 1, 2016, entitled "Transfer Line Exchanger" which are herein incorporated by reference in their entirety.

BACKGROUND OF THE INVENTION

In the cracking of paraffins to produce olefins, and particularly alpha olefins, a feed stock, for example, a lower paraffin such as ethane or naphtha, is heated to a temperature of at least about 850° C., or from about 900° C. to about 1000° C. In the process, the molecules in the feed stock lose hydrogen and become olefins. This process takes place in the heater coils inside the furnace in the radiant box of the ethylene cracker. The hot gases leaving the furnace are quickly fed to a quench exchanger. The line from the exit of the furnace tubes to the quench exchanger tube sheet or cooling section entrance is a transfer line. Due to the configuration of most plants the transfer line contains an elbow having, for example, about a 90° bend. The transfer line may include a diffuser to transition the diameter of the flow from that of the furnace pipe or tube to the diameter of the tubesheet of the quench exchanger (e.g., the external surface of the quench exchanger). There may also be several sections or fittings in the transfer line so that it may not be a unitary piece of pipe. In the quench exchanger, the gasses are quickly cooled to a temperature below which they will no longer react.

FIELD OF THE INVENTION

To date, the transfer lines have been circular in cross-section. The consideration of the cost of manufacture relative to efficiency of the transfer line, in terms of pressure, drop and erosion rate has been largely weighted to minimize the cost of manufacturing. Hence, the transfer lines have circular tubular pipes. With the increase in the price of feedstocks both for the cracking process and the furnace and the concern about greenhouse gas emissions, the weighting of the factors in the design of a transfer line exchanger is starting to move toward the efficiency of the process. Several factors to be considered in the efficiency of the furnace include the pressure drop across (i.e,. along the length of) the transfer line, the erosion rate of the transfer line and the degree of recirculation of the flow which relates to fouling (e.g., coke deposition).

U.S. Pat. No. 6,041,171 issued Mar. 21, 2000 to Blaisdell et al. discloses a method for designing a material handling system. A computer is used to select parts from a catalogue or inventory of parts. The program is more directed at assembling pre-existing parts than designing new parts.

U.S. Pat. No. 6,778,871 issued Aug. 17, 2004 teaches a method to use computer assisted design (CAD) to initially generate drawings for a pipe network. The system "designs" and "fabricates" pipe networks but it appears that this is based on standard pipe sizes (Col. 4 line 50). The system does not appear to design "custom" pipe or a custom elbow.

U.S. Pat. No. 7,398,193 issued Jul. 8, 2008 to Araki et al. discloses a method to "estimate" the wall thinning of a pipe at a "not measured location" to plan piping maintenance work. The reference is helpful in demonstrating that there are computer programs to estimate "wall thinning". The process is based on actual measurements of pipe erosion and modeling the fluid flow throughout the entire pipe network or system to predict the rate of wall thinning at a point distant from the actual measurement. This is then used to predict the locations of potential pipe failure and to schedule maintenance of the pipe network to minimize "down time". Again, the program is not directed to designing individual components for the pipe network to minimize pressure drop and erosion.

There are a number of patents in the names of Oballa, and Benum assigned to NOVA Chemicals relating to surfaces on furnace tubes and methods for making them including U.S. Pat. No. 6,824,883 issued Nov. 30, 2004; U.S. Pat. No. 6,899,966 issued May 31, 2005; and U.S. Pat. No. 7,488,392 issued Feb. 10, 2009.

Applicants have been able to determine there is no art suggesting a non-circular cross section for a transfer line.

A need exists for a transfer line for an olefin cracker which is fabricated to minimize any one of, or, combinations of, pressure drop, fouling, recirculation, erosion in the transfer line and cost (operating, capital or both).

SUMMARY OF THE INVENTION

The present invention relates to the transfer line in furnaces for cracking paraffins to olefins, particularly for the production of ethylene.

In one embodiment, the present invention provides a transfer line from an olefins cracking furnace to a quench exchanger, said transfer line having an internal flow passage having a continuously smooth and differentiable perimeter and centerline and a smoothly varying cross-section along the flow passage such that in the about 5% of the flow passage from the inlet and the outlet, the ARQ is from about 1.0 to about 1.02 and over the remaining about 90% of the length of the flow passage not less than about 5% of the flow passage has an ARQ which is from about 1.02 to about 1.5.

In a further embodiment, the ARQ over said remaining about 90% of the length of the flow passage does not change by more than about 7% over an about 5% length of the flow path.

In a further embodiment, the ARQ at one or more sections over said remaining about 90% of the length of the flow passage is from about 1.02 and about 1.30.

In a further embodiment, the ARQ over said remaining about 80% of the length of the flow passage does not change by more than about 5% over an about 5% length of the flow path.

In a further embodiment, the calculated total pressure drop across the transfer line is decreased by not less than about 10% compared to the calculated pressure drop for transfer line having an ARQ along its length from about 1.00 to about 1.02.

In a further embodiment, the ARQ at one or more sections over said remaining about 80% of the length of the flow passage is from about 1.02 and about 1.15.

In a further embodiment, the normalized calculated erosion rate of the transfer line is decreased by not less than about 10% compared to the normalized erosion rate for transfer line having an ARQ along its length from about 1.00 to about 1.02.

In a further embodiment, the transfer line has an increasing cross sectional area in the direction of flow such that the angle between the transverse normal vector and the pipe walls range from about 0° to about 85°.

In a further embodiment, the transfer line has, a smooth curve in its longitudinal direction which although may change rapidly, may not include abrupt, sharp changes of internal section (steps), and has a radius of curvature on the internal surface of the curve from unbound (straight) to half the vertical of the section radius. For example, the radius of curvature on the internal surface of the curve may be from about 1 internal pipe diameters to about 5 internal pipe diameters.

In a further embodiment, the transfer line comprises from about 20 to about 50 weight % of chromium, about 25 to about 50 weight % of Ni, from about 1.0 to about 2.5 weight % of Mn, less than about 1.0 weight % of niobium, less than about 1.5 weight % of silicon, less than about 3 weight % of titanium and other trace metals and carbon in an amount less than about 0.75 weight % and from about 0 to about 6 weight % of aluminum.

The present invention provides a method to optimize one or more of the operating characteristics selected from pressure drop, erosion rate, fouling rate, and cost (capital, operating or both) of a fixed industrial flow path defined by a continuous metal and/or ceramic envelope, comprising:

1. building a computational model comprising not less than about 5,000, or for example about 10,000 to about 100,000, or, for example, more than about 100,000, computational cells for all or a portion of the flow channel from about 5% of the length of the flow channel downstream of the inlet to from about 5% of the length of the flow channel upstream of the outlet of the initial design of said industrial flow path;

2. using computer software that solves the fundamental laws of fluid and energy dynamics for each cell simulating and summing the results of the operation of the model design from step 1 under the industrial pressure, temperature, and flow rate conditions of operation to verify one or more objective functions of interest (e.g., pressure drop, erosion rate, fouling, coke deposition and cost) to match operating conditions;

3. iteratively,
   a) deforming said computational model comprising not less than about 5,000 computational cells so that the resulting ARQ of one or more sections of the flow path is greater than about 1.02;
   b) applying the same computer software as in step 2, that solves the fundamental laws of fluid and energy dynamics for each cell simulating and summing the results of the operation of the deformed model from step 3a) under the industrial pressure, temperature, and flow rate conditions of operation used in step 2 to predict one or more objective functions of interest (e.g., pressure drop, erosion rate, fouling, coke deposition and cost) for the operation of the deformed model;
   c) storing the predicted results from step 3b);
   d) using some or all of the stored results from step 3c) with an optimization algorithm to estimate a deformation that will improve the objective function;
   e) repeating steps a), b), c), and d) until one or both of the following conditions are met:
      i) the objective function of interest goes through a beneficial local extrema; or
      ii) the rate of change of all of the functions of interest starts to approach 0.

BRIEF DESCRIPTION OF THE DRAWINGS

The features, benefits and aspects of the present invention are best understood in the context of the attached figures in which like parts or features are designated by like numbers.

DETAILED DESCRIPTION

Figure 1:
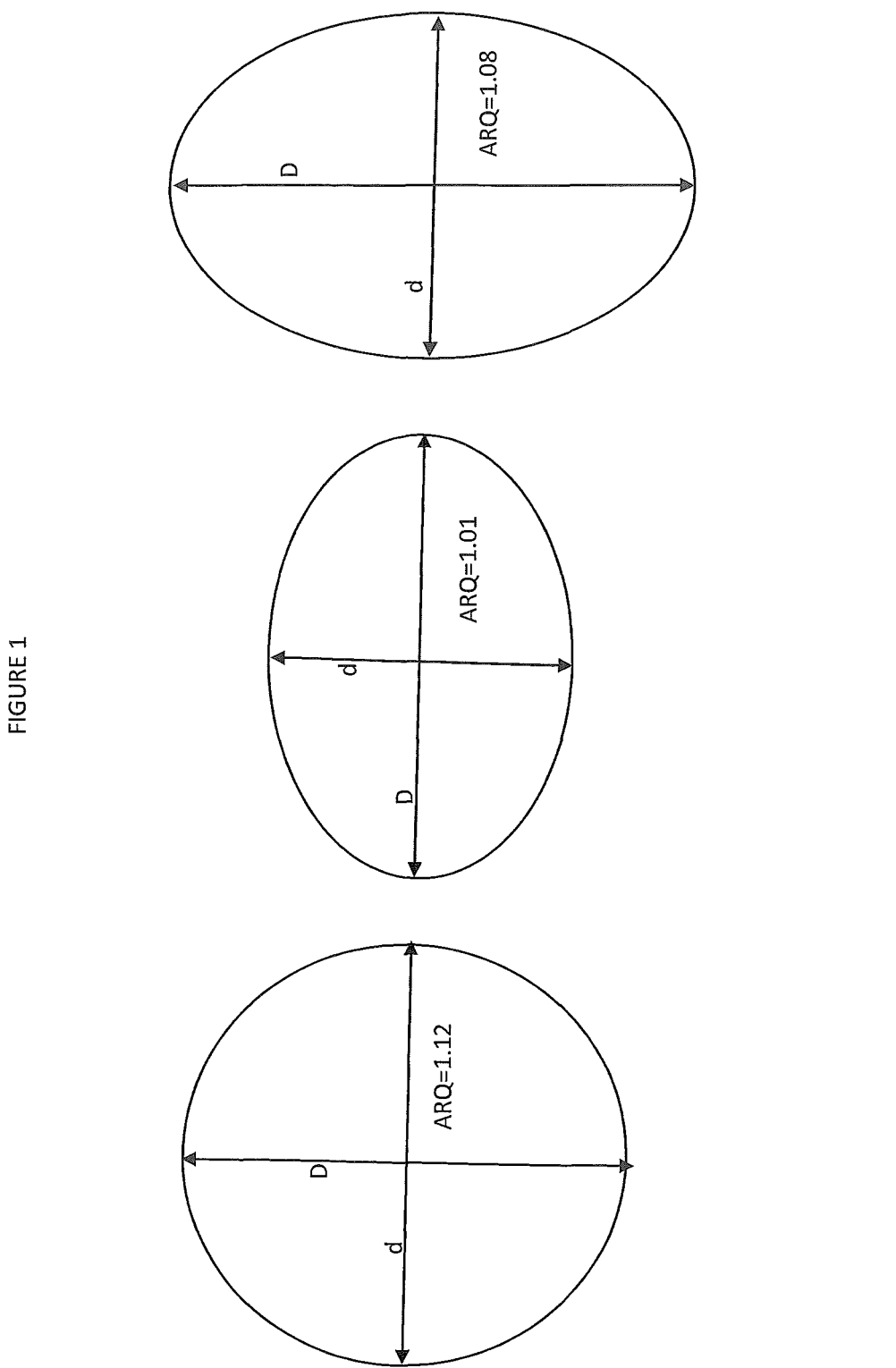
FIG. 1 shows different cross sections of a flow path having an ARQ greater than 1.

Other than in the operating examples or where otherwise indicated, all numbers or expressions referring to quantities of ingredients, reaction conditions, etc., used in the specification and claims are to be understood as modified in all instances by the term "about". Accordingly, unless indicated to the contrary, the numerical parameters set forth in the following specification and attached claims are approximations that can vary depending upon the properties that the present invention desires to obtain. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical values, however, inherently contain certain errors necessarily resulting from the standard deviation found in their respective testing measurements.

Also, it should be understood that any numerical range recited herein is intended to include all sub-ranges subsumed therein. For example, a range of "1 to 10" is intended to include all sub-ranges between and including the recited minimum value of 1 and the recited maximum value of 10; that is, having a minimum value equal to or greater than 1 and a maximum value of equal to or less than 10. Because the disclosed numerical ranges are continuous, they include every value between the minimum and maximum values. Unless expressly indicated otherwise, the various numerical ranges specified in this application are approximations.

All compositional ranges expressed herein are limited in total to and do not exceed 100 percent (volume percent or weight percent) in practice. Where multiple components can be present in a composition, the sum of the maximum amounts of each component can exceed 100 percent, with the understanding that, and as those skilled in the art readily understand, that the amounts of the components actually used will conform to the maximum of 100 percent.

As used in this specification, "relatively smoothly" in relation to the ARQ means the quotient does not change by more than about 7% over an about 5% length of the flow path.

As used in this specification, "smooth" in relation to the perimeter of the flow passage means the perimeter at an angle perpendicular to the flow is a differentiable continuous smooth line (i.e., having substantially no kinks or discontinuities). In one embodiment, the perimeter of the flow passage will not be a geometric shape having straight sides and "corners" or "angles" such as a square, a parallelogram or a triangle. Rather, the perimeter of the flow passage is defined by a continuous smooth curved line.

As used in this specification, "smooth" in relation to the center line of the flow passage means the center line of the flow passage is a differentiable continuous smooth line (i.e., having substantially no kinks or discontinuities). While the center line of the flow passage may change rapidly, it may not include abrupt, sharp changes of internal section (steps).

As used in this specification, "building a computational model" means creating a virtual three dimensional geometric model of the transfer line exchanger and filling it with a three dimensional computational mesh to create cells (e.g., at least about 5,000 cells, or greater than about 5,000 cells, or about 10,000 cells to about 100,000 cells, or greater than about 100,000 cells).

"ARQ" is defined as the ratio of aspect ratio (AR) to isoperimetric quotient (Q) of a section or segment of the flow passage perpendicular to the direction of flow (AR/Q). The "aspect ratio" (AR) is defined as the ratio of long to short side of the smallest-area rectangle into which a particular section can be circumscribed. This ratio, for the case of a convex ovoid section symmetric about one axis, is equal to the ratio of the major chord to minor chord. The major chord is the length of the longest straight line between two points in the perimeter of a closed section which may or may not cross the centroid of the section. The minor chord for such a section is the longest distance perpendicular to the major chord between two points along the perimeter of the section. It will appear clear to those skilled in the art that thus defined, the aspect ratio is greater than one.

$$AR = Long/Short$$

The "isoperimetric quotient" is defined as four times Pi ($\pi$) times the Area of the section of the flow path divided by the square of that section's perimeter. At a cross section of the flow path if the area of the cross section is A and the perimeter is L, then the isoperimetric quotient Q, is defined by $$Q = \frac{4\pi A}{L^2}$$

The isoperimetric quotient is a measure of circularity. This is illustrated in FIG. 1 and FIG. 2.

A "circle" is a cross-sectional shape with an isoperimetric quotient of one, and other cross-sectional shapes have an isoperimetric quotient less than one.

Since the ARQ ratio is the aspect ratio (AR) divided by the isoperimetric quotient (Q) and as defined AR is greater than one and Q is less than one, ARQ is also greater than one and greater than or equal to the aspect ratio.

Figure 2:
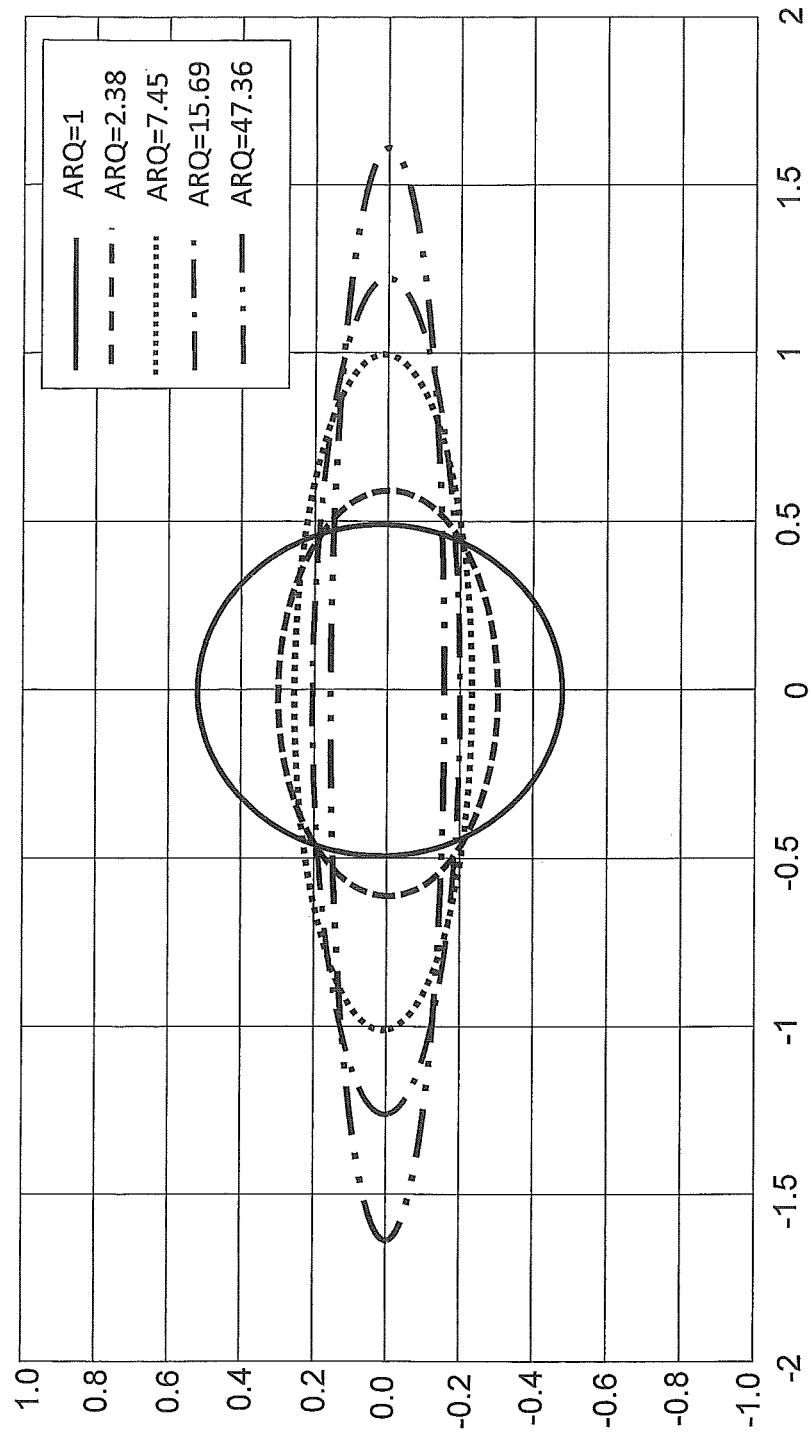
FIG. 2 shows a series of overlays of equal perimeter ellipses having different ARQ equal to or greater than 1.

FIGS. 1 and 2 demonstrate that even an ARQ near but not equal to 1 can be noticeably non-circular.

Sample calculation of an ARQ ratio:

An ellipse with a major radius "a" and a minor radius "b" has a cross sectional area $A = \pi*a*b$. The perimeter of such an ellipse can be approximated by Ramanujan's formula which states the perimeter of an ellipse being approximately:

$$L \approx \pi[3(a+b) - \sqrt{(3a+b)(3b+a)}]$$

For a particular example of an ellipse having a major radius "a" equal to four times the minor radius "b", it would have an Area $A = 4*\pi*b^2$. This four-to-one ellipse has a perimeter L $$L \approx \pi[3(5b) - \sqrt{(12b+b)(3b+4b)}]$$

$$L \approx \pi[15b - \sqrt{91b^2}] \approx 5.461\pi b$$

So a four-to-one ellipse has an isoperimetric quotient Q equal $$Q \approx \frac{16\pi^2 b^2}{29.822\pi^2 b^2} \approx 0.537$$

And since the aspect ratio of this section is 4, the ARQ of such a section is 7.45

In comparison, standard pipe has an out-of round tolerance of plus or minus about 1.5% and as such, the maximum ARQ of a nominally round section is approximately 1.0151.

Figure 3:
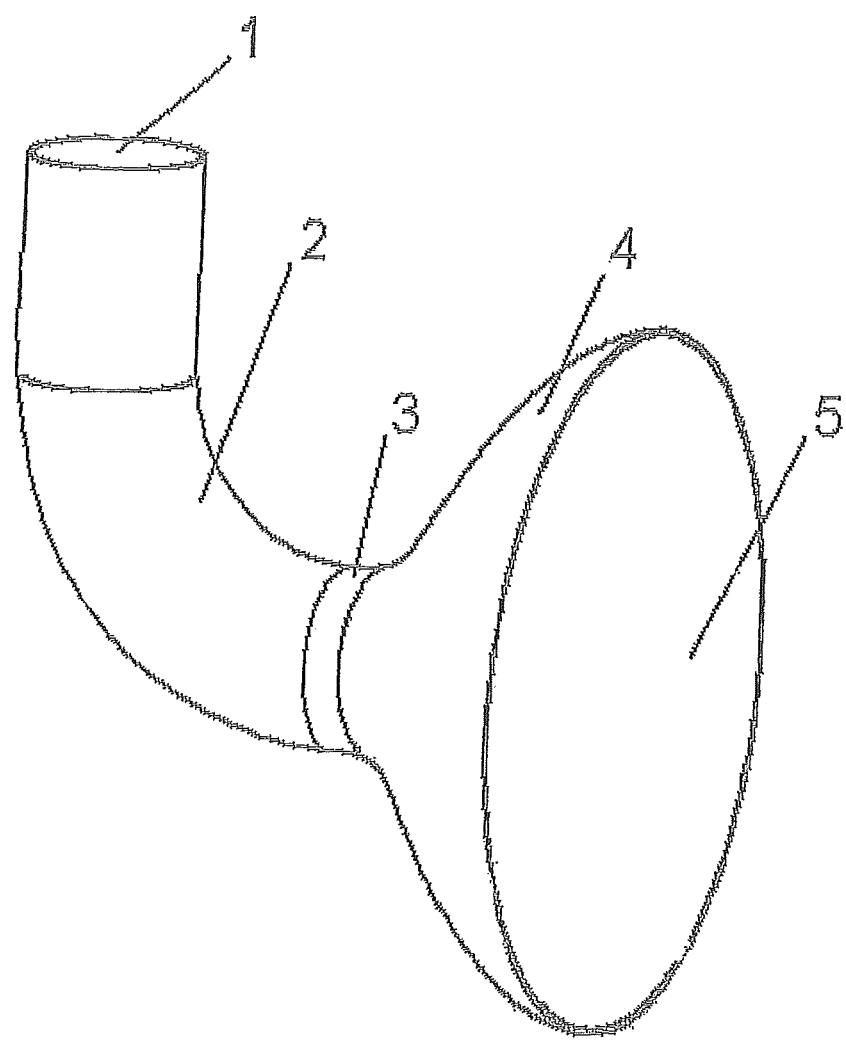
FIG. 3 is an isometric view of a transfer line of the prior art.

FIG. 3 is an isometric drawing of a prior art transfer line up to the tubesheet of the transfer line exchanger. The exchanger comprises an inlet 1, an elbow (or bend) 2, a body 3, a diffuser 4, and an outlet or exit 5. The hot gas from the cracker enters at the inlet 1, the smaller circular end of the transfer line, passes through the elbow 2, the body 3, the diffuser 4 and passes through the exit 5 at the broader or flared end of diffuser end 4.

Figure 4:
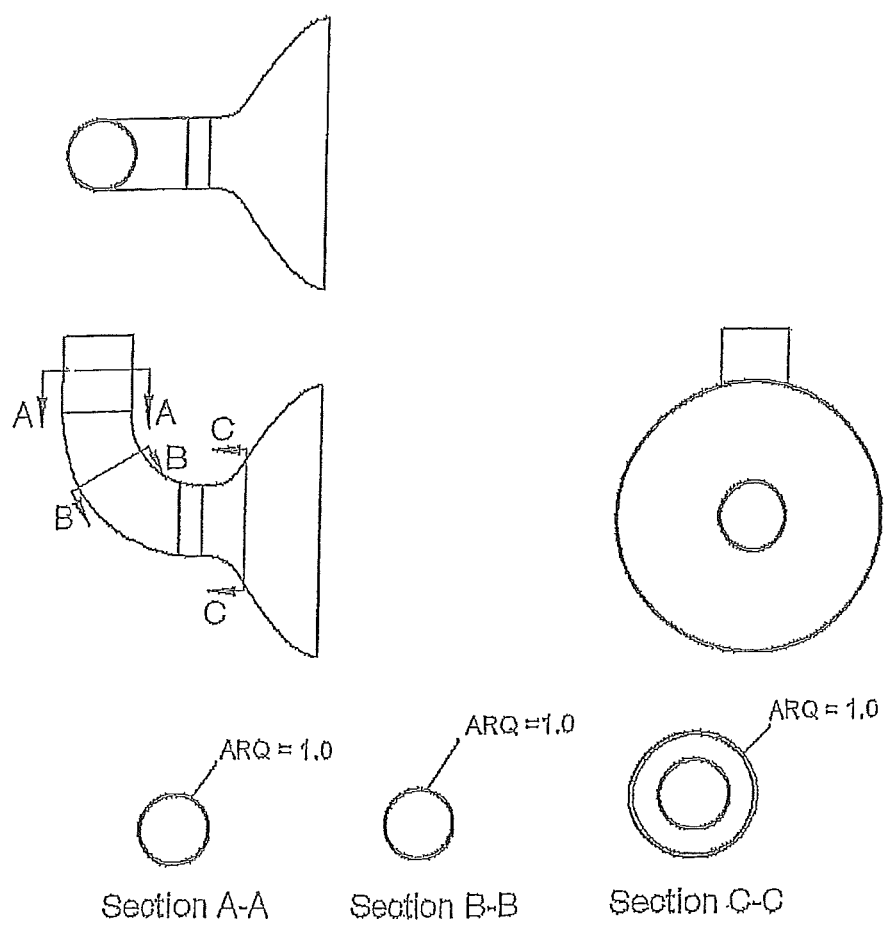
FIG. 4 is a sectional view along the flow path of FIG. 3 and cross sections A, B, and C.

In FIG. 4, cross sections are shown at A-A, B-B and C-C. In some transfer line exchangers, the flow path is circular along its entire length albeit expanding and the ARQ along the transfer line is essentially 1 (e.g., from about 1.0 to about 1.02).

In one embodiment, the cross sectional area of the flow path varies smoothly from a minimum to a maximum area along the length of the transfer line exchanger in the direction of flow of the gas, but the cross-sections are substantially round with an ARQ of about 1, other than by unintentional variations of tolerance plus or minus about 2% (maximum ARQ of about 1.02). In one embodiment, the walls of the diffuser are diverging to convert momentum energy into pressure. It also allows for the connection from a smaller diameter flow passage (e.g., the furnace tube) to the larger diameter of the heat exchanger tubesheet. The angle of the taper along the center line of the flow path is the angle between a line normal to the cross section and the flow path walls. For maximum pressure recovery, the angle will be between about 0° and about 15°, or between about 3° and about 10°, or between about 4° and about 7°. However, as this results in long transition regions, larger expansion angles may be used to maintain a shorter, less costly heat exchanger entrance. Pressure loss, fouling and erosion may be increased in this case.

In one embodiment, the transfer line has a smooth curve in its longitudinal direction, the elbow which may change rapidly but does not include abrupt or sharp changes of internal section, and has a radius of curvature on the internal surface of the curve from unbound (straight) to half the vertical of the section radius. In a further embodiment, the transfer line has a smooth curve in its flow direction which has a radius of curvature on the internal surface of the curve from about 1 internal pipe diameters to about 5 internal pipe diameters.

Figure 5:
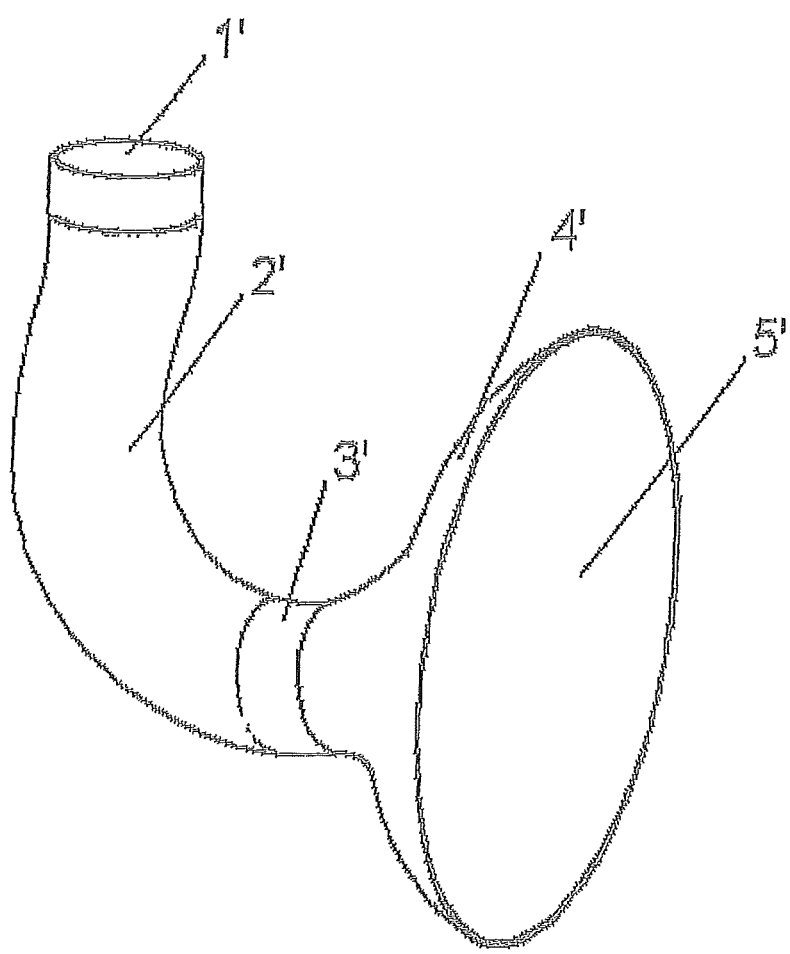
FIG. 5 is an isometric view of a transfer line in accordance with the present invention.

FIG. 5 is an isometric view of a transfer line, in accordance with one embodiment of the present invention, comprising an inlet 1', an elbow (or bend) 2', a body 3', a diffuser 4', and an exit 5'. The hot gas from the cracker enters at the inlet 1', the smaller circular end of the transfer line, passes through the elbow 2', body 3, the diffuser 4', and exits at the exit 5 at the broader or flared end of the diffuser. The exit 5' of the diffuser is circular or substantially circular.

Figure 6:
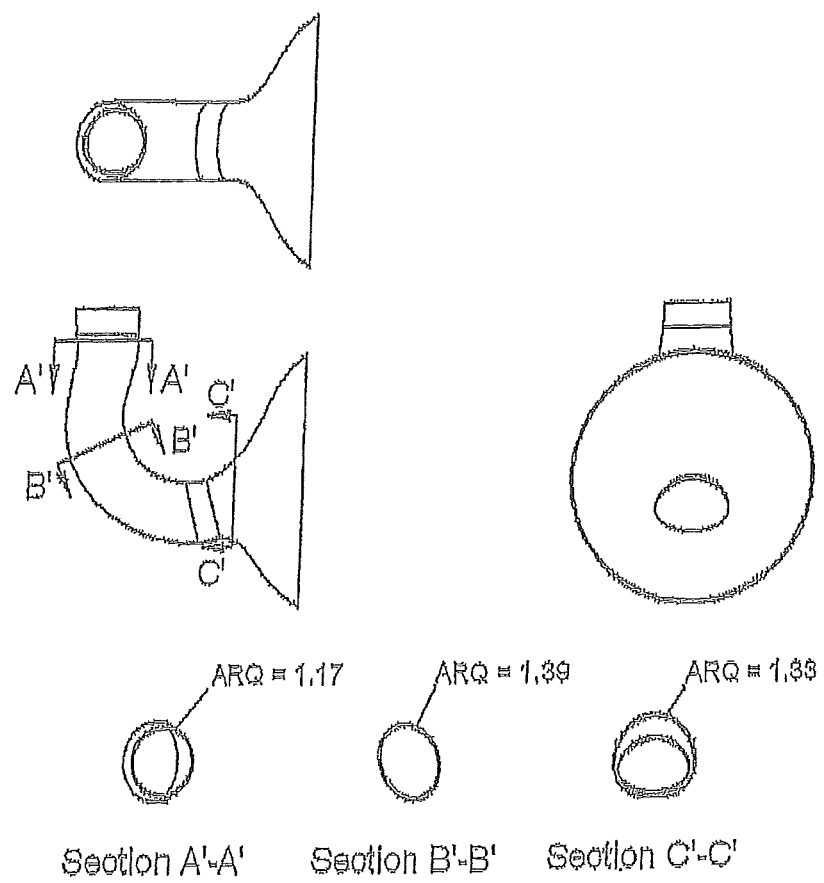
FIG. 6 is a sectional view along the flow path of FIG. 5 and cross sections at A', B', and C'.

FIG. 6 shows sectional views of transfer line in accordance with one embodiment of the present invention. The cross sections at A'-A', B'-B', and C'-C' as well as the inlet and outlet are also shown. In some embodiments, the cross sections A'-A', B'-B' and C'-C' in FIG. 6 are at the same or comparable location as A-A, B-B and C-C in FIG. 4. The cross section at the inlet 1 and exit 5 of the transfer line exchanger are substantially circular. However, the cross sections as A'-A', C'-C' and D'-D' are not circular and have an ARQ substantially higher than 1.

In this embodiment the ARQ varies smoothly from about 1 at either end (inlet 1 and exit 5 (round furnace pipe connected to a round tubesheet)) but reaches a maximum non-roundness with a maximum ARQ of about 1.39.

The shape of the cross section of the flow path may be elliptical, ovoid, segmented or asymmetric in nature. The area of the cross-section may also be held constant, increase or decrease according to the function to be achieved. A twist may optionally be imposed on adjacent cross sections either by means of interior swirling vanes or beads (e.g., a welded bead on the interior of the pipe) within the transfer line exchanger or by the bulk twisting of the cross sections relative to each other.

However, it should be noted that different shapes may have a comparable ARQ and that a low change in the quotient may in fact result in a significant change in the cross section shape of the flow path such as from a near ellipse to a "flattened egg shape." This is demonstrated in FIGS. 1 and 2. In some embodiments, an about 1% change in ARQ can have a profound effect on the flow characteristics as indicated by pressure drop, for example.

In one embodiment, the cross section of the transfer line exchanger within the last about 5% of the flow path from the inlet and exit (or outlet) of the transfer line exchanger have an ARQ approaching unity from above; for example, from about 1.02 to about 1.0, or from about 1.01 to about 1.

In one embodiment, the remaining about 90% of the flow path has one or more sections where the ARQ is from about 1.02 to about 1.50, or from about 1.02 to about 1.3, or from about 1.02 to about 1.12. The interior of the flow path is "smooth" in the sense that the change in the ARQ, in about 5% sections of the remaining flow path, does not change by more than about 7%, or less than about 5%.

The shape of the cross sections of the flow path is optimized to obtain a local beneficial minimum or maximum (known collectively as "extrema") of an objective function. Such objective function may be any parameter affecting the economics of the operation of the transfer line, including, the cost (capital and or operating), itself include but is not limited to pressure drop, erosion rate of the fluid-contacting surfaces, weight of the component, temperature profile, residence time and rate of fouling (or coke deposition).

There are a number of software applications available which are useful in the present invention. These include SOLIDWORKS software for the creation and parametric manipulation of the flow geometry, ANSYS MECHANICAL software for the calculation of material stress and ANSYS FLUENT software to determine the flow pattern, pressure drop and erosion rate used in calculating the objective function corresponding to a particular geometry.

Procedurally, one way to find a local objective function extremum is by sequentially applying a small perturbation to a parameter affecting the shape of the transfer line and determining the resulting value of the objective function by either analytical techniques, experiments or numerical computation. A deformation parameter is defined as a value which can be uniquely mapped to a change in geometry by means of scaling, offsetting or deforming any or all of the sections in a deterministic fashion. Each parameter may also be bounded to prevent geometric singularities, unphysical geometries or to remain within the boundaries of a physical solution space. After each of a finite and arbitrary number of parameters has been perturbed, any one of a series of mathematical techniques may be used to find the local extremum. In one such technique, a vector of steepest approach to the objective function extremum is determined as a linear combination of parameter changes. The geometry is progressively deformed in the direction of steepest approach and the value of the objective function determined for each deformation until a local extremum is found. The process is then restarted with a new set of perturbations of the parameter set. Other techniques that may be used to advance, the search for a local extremum include Multi objective genetic algorithms, Metamodeling techniques, the Monte Carlo Simulation method or Artificial Neural Networks.

For example, a model of the original design is built. That is a three dimensional finite model of the transfer line is created. The model may include the internal flow passage (void) within the transfer line exchanger. The model may also include the external surface of the transfer line exchanger. The model may then be divided into (or filled with) cells, for example, about 5,000 cells, or at least about 5000 cells, or from about 10,000 to about 100,000 cells, or, for example, more than about 100,000 cells (e.g., about 150,000, or about 200,000, or about 250,000, or about 500,000). To some extent, this is dependent on computing power available and how long it will take to run the programs for each deformation of the original model. There are a number of computer programs which may be used to build the original model such as, for example, finite element analysis software (e.g., ANSYS Mechanical).

Then the model needs to be "initialized". That is a fluid dynamics and energy (of mass, energy and momentum, etc.) dynamics computer program is applied to each cell of the model to solve the operation of that cell at given operating conditions for the transfer line exchanger (e.g., mass of gas passing through the transfer line exchanger, flow velocity, temperature, and pressure, erosion rate, fouling rate, recirculation rate, etc.) to calculate one or more objective functions. The sum of the results of each cell operation describes the overall operation of the transfer line exchanger. This is, run iteratively until the model and its operation approach, or closely match, actual plant data. Generally, the model should be initialized so that for one or more of objective functions of the simulation is within about 5%, or within about 2%, or within about 1.5% of the actual plant operating data for that objective function of the transfer line exchanger. One fluid and/or energy dynamics program which is suitable for the simulation is ANSYS FLUENT software.

Once the design of the transfer line and its operation is initialized, the model of the transfer line is iteratively deformed, for example, in a small manner but incremental manner and the simulated operation of the deformed part is run to determine the one or more objective functions for the deformed transfer line exchanger (for the cells and the sum of the cells or even cells in specified location or regions (at the internal radius of curvature of a bend). For example, the deformation is applied to all of part of the flow channel of the transfer line exchanger within about 5% of the flow channel downstream of the inlet to about 5% of the flow channel upstream of the exit (i.e., about 90% of the transfer line is available for deformation). In some instances, the deformation may occur in one or more sections or parts within about 10% of the flow channel downstream of the inlet to about 10% of the flow channel upstream of the exit (i.e., about 80% of the transfer line is available for deformation). While the deformation could be applied to the whole length of transfer line available for deformation it may be useful to apply the deformation to sections or portions of the transfer line. For example, the last or first half, third or quarter or combinations thereof could be deformed. The results (e.g., one or more objective functions and the sum of each such objective function) of the simulated operation of the deformed transfer line exchanger are stored in the computer.

The deformation of the transfer line may be accomplished by applying a further computer program to the design which incrementally deforms the part. One such commercially available deformation and optimization software is sold under the trademark Sculptor. However, one may use a neural network to optimize the location and degree of deformation to speed up or focus the iterative process.

The stored calculated objective function(s) for the operation of the deformed transfer line are then compared until either:

1) an extrema of one or more objective functions is reached; or
2) the rate of change in the one or more objective functions is approaching zero.

More generally, the present invention provides a method to optimize one or more of the operating characteristics of a fixed industrial flow path defined by a continuous metal envelope, selected from pressure drop, erosion rate, and coke deposition rate comprising:

1. building a numerical model comprising not less than about 5,000, or, for example, more than about 100,000, computational cells of the portion of the flow channel, for example, from about 5% of the flow channel downstream of the inlet and to about 5% of the flow channel upstream of the outlet (e.g., about 90% of the of the flow channel of the transfer line) of the initial design;
2. simulating (on a computational cell level and summed) the operation of the model design from step 1 using fluid and energy dynamics software under the industrial pressure, temperature, and flow rate conditions of operation to numerically determine one or more of the functions of interest (pressure drop, erosion rate, fouling rate and cost (capital and operating)) approach (within about 5%) or match actual operating conditions;
3. iteratively,
   a) deforming said numerical model comprising not less than about 5,000 computational cells by deforming the geometry such that the resulting ARQ of the section is materially greater than about 1.02;
   b) simulating the operation of the deformed model under the plant operating conditions used in step 2 to determine one or more objective functions of interest (e.g., pressure drop, erosion rate, fouling rate, and cost (capital and/or operating);
   c) calculating and storing said one or more of functions of interest calculated in step b);
   d) using some or all of the stored results from step 3c) with an optimization algorithm to estimate a deformation that will improve the objective function;
   e) comparing the stored objective functions of interest until one or both of the following conditions are met:
      i) the objective function reaches a desirable local extrema; or
      ii) the objective function ceases to change in the parametrized direction.

Some objective function value, for example, pressure drop and erosion rate, at each evaluation stage in the process of finding the local extremum can be obtained via Computational Fluid Dynamics. If the change in transfer line cross-sections along the flow path is selected so that the calculated total pressure drop across the line decreases by about 10% from the baseline condition made of standard components (i.e., where the ARQ is from about 1 to about 1.02 along the about 90% or about 80% of transfer line flow path) which is used as a comparison benchmark and the erosion rate of the line is decreased by more than about 5% compared to the baseline, calculated using a combination of structural finite element analysis software; computational fluid dynamics simulation of the flow rate and a geometry manipulating software that alters the shape of the transfer line in a parametric fashion.

For example, the models will be run until the change in objective function between successive iterations is less than about 10% or less than about 1%. In one embodiment, when compared to a baseline of a conventionally designed transfer line made of standard components, the present invention has a decrease in total pressure drop of over about 10% and the subsequent erosion rate and fouling rate of the transfer line is also affected and decreased when compared to the baseline conditions. This decrease is at least in the order of magnitude of the total pressure drop. In an optional embodiment, the fouling (e.g., coke deposition) rate of the transfer line is also determined. The fouling rate as noted below is also a function of the metallurgy of the transfer line and the surface coating in the transfer line.

The fouling rate for the transfer line exchanger and, optionally, the quench exchanger should be less than about 0.1 $mg/cm^2/hr$, or less than about 0.07 $mg/cm^2/hr$, or less than about 0.05 $mg/cm^2/hr$, more or less than about 0.03 $mg/cm^2/hr$, or less than about 0.02 $mg/cm^2/hr$. The coke rate may be affected by a number of factors including the cross sectional shape of the transfer line exchanger and the metallurgy of the transfer line exchanger. In one embodiment, for computer simulations, the metallurgy of the transfer line may be considered constant, and after the preferred shape is determined, the metallurgy of the transfer line may be selected.

In one embodiment, due to space constraints, the transfer line may "bend" prior to entering the quench exchanger. The radius of curvature taken at the inside of the curve in the transfer line is, for example, from about 1 to about 10 pipe inner diameters or from about 3 to about 5 pipe inner diameters.

The transfer line and the quench exchanger may be constructed from stainless steel. For example, the steel has a surface which tends to mitigate the formation of coke such as that disclosed in U.S. Pat. No. 6,824,883 issued Nov. 30, 2004 to Benum et al. assigned to NOVA Chemicals (International) S.A.

In one embodiment, the steel has a high nickel and chrome content.

In one embodiment, the stainless steel comprises from about 20 to about 50, or from about 20 to about 38 weight % of chromium and at least about 1.0 weight %, up to about 2.5 weight % or not more than about 2 weight % of manganese. The stainless steel should contain less than about 1.0, or less than about 0.9 weight % of niobium and less than about 1.5, or less than about 1.4 weight % of silicon. The stainless steel may further comprise from about 25 to about 50 weight % of nickel, from about 1.0 to about 2.5 weight % of manganese and less than about 3 weight % of titanium and all other trace metals, and carbon in an amount of less than about 0.75 weight %. The steel may comprise from about 25 to about 50, or from about 30 to about 45 weight % nickel and, for example, less than about 1.4 weight % of silicon. The balance of the stainless steel is substantially iron. In a further embodiment, the stainless steel may contain from about 0 up to about 6 weight %, or from about 3 to about 6 weight % of aluminum.

In one embodiment, alloys may also be used, for example, nickel and/or cobalt based extreme austenitic high temperature alloys (HTAs). In one embodiment, the alloys comprise a major amount of nickel or cobalt. For example, the high temperature nickel based alloys comprise from about 50 to about 70, or from about 55 to about 65 weight % of Ni; from about 20 to about 10 weight % of Cr; from about 20 to about 10 weight % of Co; and from about 5 to about 9 weight % of Fe and the balance one or more of the trace elements noted below to bring the composition up to 100 weight %. For example, the high temperature cobalt based alloys comprise from about 40 to about 65 weight % of Co; from about 15 to about 20 weight % of Cr; from about 20 to about 13 weight % of Ni; less than about 4 weight % of Fe and the balance one or more trace elements as set out below and up to about 20 weight % of W. The sum of the components adding up to 100 weight %.

In another embodiment, newer alloys may be used which contain up to about 12% Al, for example, less than about 7 weight %, or about 2.5 to about 3 weight % aluminum as disclosed for example in U.S. Pat. No. 7,278,828 issued Oct. 9, 2007 to Steplewski et al., assigned to General Electric Company. For example, in the high cobalt and high nickel steels, the aluminum may be present in an amount up to about 3 weight %, or between about 2.5 and about 3 weight %. In the high chrome high nickel alloys (e.g., about 13 to about 50, or about 20 to about 50, weight % of Cr and from about 20 to about 50 weight % of Ni), the aluminum content may range up to about 10, for example, less than about 7, or from about 2 to about 7 weight %.

In some embodiments of the invention, the steel may further comprise a number of trace elements including at least about 0.2 weight %, up to about 3 weight % or about 1.0 weight %, up to about 2.5 weight % or not more than about 2 weight % of manganese; from about 0.3 to about 2, or about 0.8 to about 1.6 or less than about 1.9 weight % of Si; less than about 3, or less than about 2 weight % of titanium, niobium (for example, less than about 2.0, or less than about 1.5 weight % of niobium) and all other trace metals; and carbon in an amount of less than about 2.0 weight %. The trace elements are present in amounts so that the composition of the steel totals 100 weight %.

In one embodiment, the transfer line (and the quench exchanger) may be treated to create a spinel surface on the internal surface. There appear to be a number of treatments which may create a spinel surface. One treatment, for example, comprises (i) heating the stainless steel in a reducing atmosphere comprising from about 50 to about 100 weight % of hydrogen and from about 0 to about 50 weight % of one or more inert gases at rate of about 100° C. to about 150° C. per hour to a temperature from about 800° C. to about 1100° C.; (ii) then subjecting the stainless steel to an oxidizing environment having an oxidizing potential equivalent to a mixture of from about 30 to about 50 weight % of air and from about 70 to about 50 weight % of one or more inert gases at a temperature from about 800° C. to about 1100° C. for a period of time from about 5 to about 40 hours; and (iii) cooling the resulting stainless steel to about room temperature at a rate of less than about 200° C. per hour.

In one embodiment, this treatment should be carried out until there is an internal surface on the transfer line (and, optionally, the quench exchanger) having a thickness greater than about 2 microns, for example, from about 2 to about 25, or from about 2 to about 15 microns or from about 2 to about 10 microns and substantially comprising a spinel of the formula $Mn_xCr_{3-x}O_4$, where x is a number from about 0.5 to about 2, for example, from about 0.8 to about 1.2. In one embodiment, X is 1 and the spinel has the formula $MnCr_2O_4$.

For example, the spinel surface covers not less than about 55%, or not less than about 60%, or not less than about 80%, or not less than about 95% of the stainless steel.

In a further embodiment, there may be a chromia ($Cr_2O_3$) layer intermediate the surface spinel and the substrate stainless steel. The chromia layer may have a thickness up to about 30 microns, generally from about 5 to about 24, or from about 7 to about 15 microns. As noted above, the spinel overcoats the chromia geometrical surface area. In one embodiment, there may be very small portions of the surface which may only be chromia and do not have the spinel overlayer. In this sense, the layered surface may be non-uniform. In one embodiment, the chromia layer underlies or is adjacent not less than about 80, or not less than about 95, most or not less than about 99% of the spinel.

In a further embodiment, the internal surface of the transfer line and, optionally, the quench exchanger may comprise from about 15 to about 85 weight %, or from about 40 to about 60 weight % of compounds of the formula $Mn_xCr_{3-x}O_4$, wherein x is from about 0.5 to about 2 and from about 85 to about 15 weight %, or from about 60 to about 40 weight % of oxides of Mn and Si selected from MnO, $MnSiO_3$, $Mn_2SiO_4$ and mixtures thereof provided that the surface contains less than about 5 weight % of $Cr_2O_3$.

The present invention will further be described by reference to the following demonstrations, which are merely illustrative of the invention and are not intended to be limiting.

DEMONSTRATION

Figure 7:
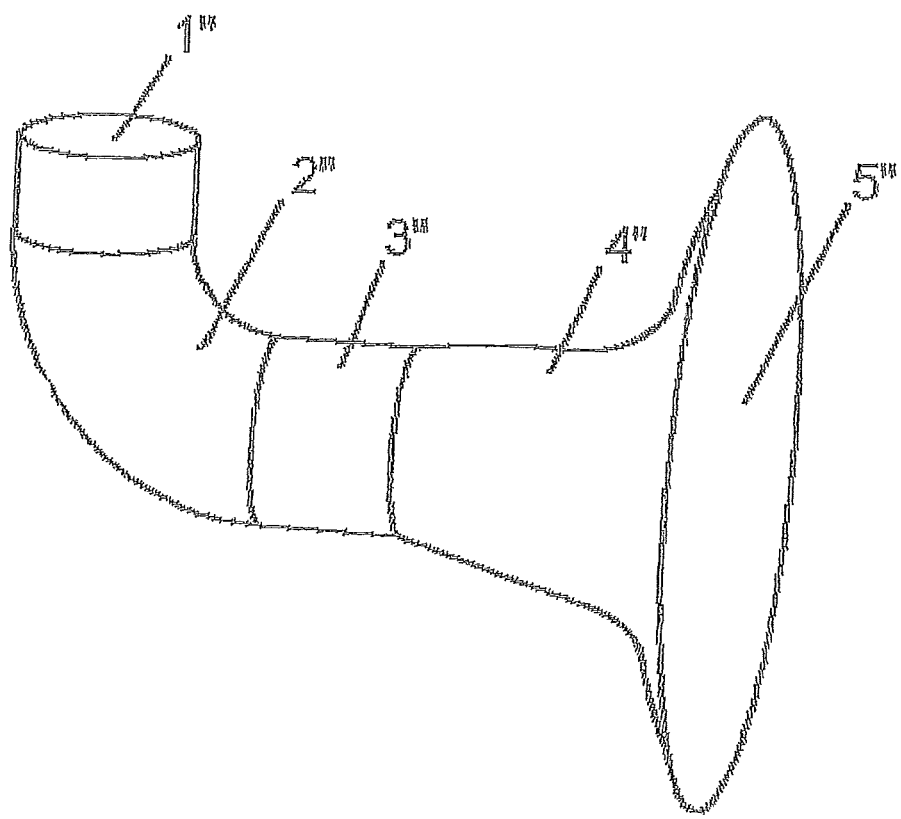
FIG. 7 is an isometric view of a transfer line designed in accordance with example 1.
Figure 8:
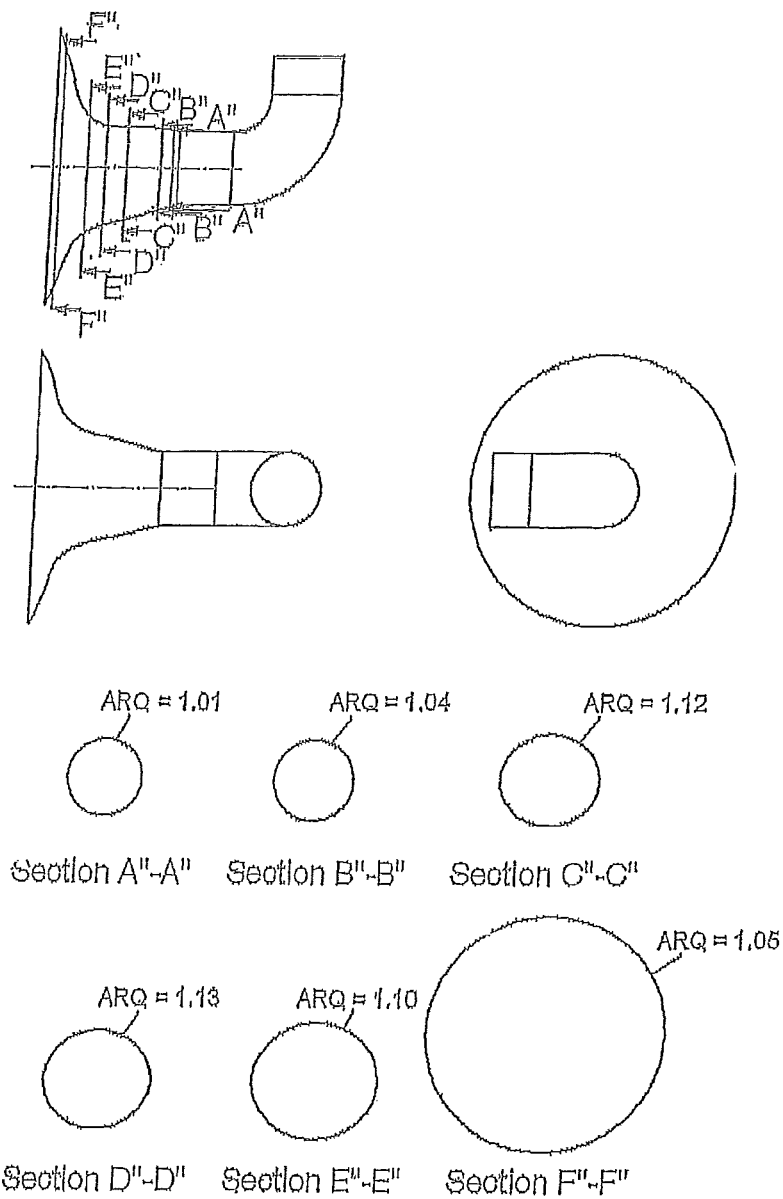
FIG. 8 is a sectional view along the flow path of FIG. 7 and cross sections at A", B", C", D", E", F" and G".

The present invention will now be demonstrated with reference to FIGS. 3 and 4 and 7 and 8. FIGS. 3 and 4 are the conventional transfer line exchanger and FIGS. 7 and 8 are a modified design in accordance with the present invention.

The finite element analysis software and computational fluid dynamic software have been used to model NOVA Chemicals commercial ethylene cracking furnace piping at Joffre and Corunna. The models are sufficiently accurate to generally predict the commercial operation of industrial plants.

A numerical model of the conventional transfer line as shown in FIGS. 3 and 4, a circular tapered tube with a 90° bend and trumpet-like diffuser connecting to the heat exchanger tubesheet was created using a commercial finite element software program. A computational fluid dynamics program was also applied for the analysis of the conventional transfer line for gas at a temperature of greater than 600° C. and a flow rate of 3.97 Kg/s. The pressure drop and erosion rate were determined using ANSYS FLUENT software.

Using the shape deformation and optimization software Sculptor the circular cross section of the conventional pipe computational or numerical model was deformed into an asymmetric and arbitrary shape independently at several transverse planes of the original connecting pipe to generate a "deformed" shape based on a series of deformation parameters per section. The ARQ of the resulting sections having a maximum ARQ substantially greater than 1.02. The metallurgy of the pipe was maintained constant for these models. The pressure drop and erosion rate were also calculated for the "deformed" pipe.

The process was applied iteratively until no further improvements in pressure drop or erosion rate were found. The resulting geometry and ARQ values are shown in FIG. 7 and FIG. 8.

Table 1 is a summary of representative data from the computer modeling.

TABLE 1

| Simulation or Iteration Number | Normalized Pressure Drop | Reduction in Pressure Drop | Normalized Erosion Rate | Reduction in Erosion Rate |
| --- | --- | --- | --- | --- |
| 1 (Base design in FIG. 1) | 1.0 | 0% | 1.0 | 0% |
| 2 | 0.98 | 1% | 0.99 | 1% |
| 4 | 0.92 | 8% | 0.96 | 4% |
| 8 | 0.89 | 11% | 0.94 | 6% |
| 14 | 0.85 | 15% | 0.90 | 10% |
| 16 | 0.85 | 15% | 0.89 | 11% |
| 21 | 0.82 | 18% | 0.87 | 13% |

Although the change in ARQ appears to be moderate, the resulting change in transfer line performance has been dramatic. In terms of time in service until the unit needs to be decoked, the present demonstration of the invention increased the run time from a plant average of 90 days to an initial run of 290 days, or a 220% increase in run time. The factors that determine the end of a run include pressure drop across the transfer line and temperature increase at the entrance of the exchanger.

The present invention has been described with reference to certain details of particular embodiments thereof. It is not intended that such details be regarded as limitations upon the scope of the invention except insofar as and to the extent that they are included in the accompanying claims.

What is claimed is:

1. A method to optimize one or more of the operating characteristics selected from the group consisting of pressure drop, erosion rate, fouling rate, and cost (capital, operating, or both) of a fixed industrial flow path defined by a continuous metal envelope, wherein the metal is chosen from steel having a high nickel and chrome content, steel having a high cobalt and high nickel content, and austenitic high temperature alloys (HTAs), comprising:
   a) building a computational model comprising not less than 5,000, computational cells of the portion of flow channel from 5% of the length of the flow channel downstream of the inlet to from 5% of the length of the flow channel upstream of the outlet of the initial design of said industrial flow path;
   b) using computer software that solves the fundamental laws of fluid and energy dynamics for each cell, simulating and summing the results of the operation of the model design from step a) under the industrial pressure, temperature, and flow rate conditions of operation to verify one or more objective functions of interest;
   c) iteratively
   1) deforming said computational model comprising not less than 5,000 computational cells so that the resulting ARQ is from 1.02 to 1.15, where ARQ is defined as the ratio of aspect ratio(AR) to isoperimetric quotient (Q) of a section of the flow path perpendicular to the direction of flow;
   2) applying the same computer software as in step b), that solves the fundamental laws of fluid and energy dynamics for each cell, simulating and summing the results of the operation of the deformed model from step c1) under the industrial pressure, temperature, and flow rate conditions of operation used in step b) to predict one or more objective functions of interest for the operation of the deformed model;
   3) storing the predicted results from step c2);
   4) using some or all of the stored results from step c3) with an optimization algorithm to estimate a deformation that will improve the objective function;
   5) repeating steps 1), 2), 3), and 4) until one or both of the following conditions are met:
      i) the objective function of interest goes through a beneficial local extrema; or
      ii) the rate of change of all of the functions of interest starts to approach 0.

2. The method according to claim 1, wherein the computational model has from 10,000 to 100,000 computational cells.

3. The method according to claim 2, wherein the flow path does not change by more than 7% over a 5% length of the flow path.

4. The method according to claim 3, wherein the ARQ at one or more sections over the flow path is from 1.02 and 1.12.

5. The method according to claim 4, wherein the ARQ over 80% of the length of the flow path does not change by more than 5% over a 5% length of the flow path.

6. The method according to claim 5, wherein the calculated total pressure drop across the flow path is decreased by not less than 10% compared to the calculated pressure drop for a flow path having an ARQ along its length from 1.00 to 1.02.

7. The method according to claim 6, wherein normalized calculated erosion rate of the flow path is decreased by not less than 10% compared to the normalized erosion rate for a flow path having an ARQ along its length from 1.00 to 1.02.

8. The method according to claim 7, wherein the flow path has an increasing cross sectional area in the direction of flow such that the angle between the transverse normal vector and the flow path walls range from 0° to 85°.

9. The method according to claim 7, wherein the flow path has a smooth curve in its longitudinal direction and a radius of curvature on the internal surface of the curve from unbound to half the vertical of the section radius.

10. The method according to claim 7, wherein the flow path is defined by a continuous metal envelope comprising from 20 to 50 weight % of chromium, 25 to 50 weight % of Ni, from 1.0 to 2.5 weight % of Mn, less than 1.0 weight % of niobium, less than 1.5 weight % of silicon, less than 3 weight % of titanium, and all other trace metals and carbon in an amount less than 0.75 weight %, and from 0 to 6 weight % of aluminum.

11. The method according to claim 7, wherein the flow path is defined by a continuous metal envelope comprising from 40 to 65 weight % of Co; from 15 to 20 weight % of Cr; from 20 to 13 weight % of Ni; less than 4 weight % of Fe and the balance of one or more trace elements and up to 20 weight % of W the sum of the components adding up to 100 weight %.

12. The method according to claim 7, wherein the flow path is defined by a continuous metal envelope comprising from about 55 to 65 weight % of Ni; from about 20 to 10 weight % of Cr; from about 20 to 10 weight % of Co; and from about 5 to 9 weight % of Fe, and the balance of one or more trace elements.

\* \* \* \* \*